(12) United States Patent
Cho et al.

(10) Patent No.: US 10,045,436 B2
(45) Date of Patent: Aug. 7, 2018

(54) PRINTED CIRCUIT BOARD AND METHOD OF MANUFACTURING THE SAME

(71) Applicant: SAMSUNG ELECTRO-MECHANICS CO., LTD., Suwon-Si, Gyeonggi-Do (KR)

(72) Inventors: Suk Hyeon Cho, Suwon-si (KR); Hyo Seung Nam, Hwasung-si (KR); Yong Sam Lee, Yongin-si (KR); Seok Hwan Ahn, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 665 days.

(21) Appl. No.: 14/537,998

(22) Filed: Nov. 11, 2014

(65) Prior Publication Data

US 2015/0129293 A1 May 14, 2015

(30) Foreign Application Priority Data

Nov. 11, 2013 (KR) ........................ 10-2013-0136274

(51) Int. Cl.
*H05K 1/02* (2006.01)
*H05K 3/42* (2006.01)
(Continued)

(52) U.S. Cl.
CPC ........... *H05K 1/0271* (2013.01); *H01L 24/97* (2013.01); *H05K 3/0052* (2013.01); *H05K 3/429* (2013.01); *H05K 3/4605* (2013.01); *H01L 2224/16225* (2013.01); *H01L 2224/97* (2013.01); *H01L 2924/12042* (2013.01); *H01L 2924/15311* (2013.01); *H05K 3/002* (2013.01); *H05K 3/007* (2013.01); *H05K 3/0029* (2013.01); *H05K 3/0047* (2013.01); *H05K 3/4644* (2013.01);
(Continued)

(58) Field of Classification Search
CPC .. H05K 1/0271; H05K 1/0306; H05K 1/0366; H05K 1/115; H05K 3/4605
See application file for complete search history.

(56) References Cited

U.S. PATENT DOCUMENTS 6,545,353 B2 * 4/2003 Mashino ........... H01L 23/49822
 257/700
8,975,535 B2 * 3/2015 Imamura ............... H01L 21/481
 174/255

(Continued)

FOREIGN PATENT DOCUMENTS

JP   11-103171   4/1999
JP   2001-44141   2/2001
(Continued)

OTHER PUBLICATIONS

Japanese Office Action dated Sep. 29, 2015, in counterpart Japanese Application No. 2014-227818 (4 pages, in Japanese).

(Continued)

*Primary Examiner* — Timothy Thompson
*Assistant Examiner* — Amol Patel
(74) *Attorney, Agent, or Firm* — NSIP Law

(57) ABSTRACT

A printed circuit board and a method of manufacturing the same. In one embodiment, a printed circuit board includes: a core made of a glass material; an insulator surrounding the core; and a via connecting internal circuit layers through the core and the insulator.

3 Claims, 15 Drawing Sheets

(51) Int. Cl.
*H05K 3/00* (2006.01)
*H05K 3/46* (2006.01)
*H05K 1/11* (2006.01)
*H05K 1/03* (2006.01)
*H01L 23/00* (2006.01)

(52) U.S. Cl.
CPC .............. *H05K 2201/017* (2013.01); *H05K 2201/0187* (2013.01); *H05K 2201/0195* (2013.01); *H05K 2201/0909* (2013.01); *H05K 2201/09136* (2013.01); *H05K 2201/09827* (2013.01); *H05K 2201/09881* (2013.01); *H05K 2201/2009* (2013.01); *H05K 2203/1536* (2013.01)

(56) References Cited

U.S. PATENT DOCUMENTS

| | | | | |
|---|---|---|---|---|
| 2006/0244128 | A1* | 11/2006 | Hayashi | H01L 21/4853 257/712 |
| 2009/0107715 | A1* | 4/2009 | Sasaoka | H05K 1/188 174/260 |
| 2009/0166077 | A1* | 7/2009 | Hirakawa | H05K 1/0271 174/262 |
| 2012/0247813 | A1* | 10/2012 | Ueda | H01L 23/49816 174/251 |
| 2013/0264101 | A1* | 10/2013 | Furuichi | H05K 1/115 174/251 |
| 2014/0015121 | A1* | 1/2014 | Koizumi | H01L 23/48 257/734 |

FOREIGN PATENT DOCUMENTS

| | | |
|---|---|---|
| JP | 2001-244605 A | 9/2001 |
| JP | 2007-266136 A | 10/2007 |
| JP | 2010-10329 A | 1/2010 |
| JP | 2010-114187 A | 5/2010 |
| JP | 2013-219191 A | 10/2013 |
| KR | 10-2007-0076737 | 7/2007 |

OTHER PUBLICATIONS

Korean Office Action dated Oct. 30, 2014 in corresponding Korean Patent Application No. 10-2013-0136274.

Japanese Office Action dated Jun. 14, 2016, in counterpart Japanese Application No. 2014-227818 (1 page in English, 2 pages in Japanese).

* cited by examiner

PRINTED CIRCUIT BOARD AND METHOD OF MANUFACTURING THE SAME

CROSS-REFERENCE TO RELATED APPLICATIONS

This application claims the foreign priority benefit under 35 U.S.C. Section 119 of Korean Patent Application Serial No. 10-2013-0136274, filed Nov. 11, 2013, which is hereby incorporated by reference in its entirety into this application.

BACKGROUND

1. Field

Embodiments of the present invention relate to a printed circuit board and a method of manufacturing the same, and more particularly, to a printed circuit board, which can prevent exposure of a side surface of a core, and a method of manufacturing the same.

2. Description of Related Art

In recent times, as the thickness of portable devices is being gradually decreased, there have been efforts to reduce the entire thickness of internal components by manufacturing a thin substrate on which a plurality of electronic components are mounted with the thinning of the electronic components mounted inside the portable devices.

In particular, when manufacturing a thin substrate on which the plurality of electronic components are mounted, the substrate is exposed to a high temperature in a reflow process etc. during the manufacturing process of the substrate or during the mounting of the electronic components, and concave or convex warpage occurs due to the properties of materials during the repetition of high temperature processing and cooling.

In order to prevent the warpage of the substrate, there have been efforts to increase the modulus of raw materials used in the manufacturing process of the substrate and reduce the difference in the coefficient of thermal expansion (CTE) between the raw materials to improve the warpage due to the difference in the CTE in the reflow process, but the technical development for this is needed.

Further, as a means to prevent the warpage during the manufacturing process of the substrate by the improvement of a physical structure, a method of inserting a metal reinforcing member or a glass sheet in the substrate to increase the modulus of a core material of the substrate is being considered. However, it is difficult to process a through hole or a via since the metal core or the glass core has a high modulus. Even though a printed circuit board without warpage can be manufactured, the core is exposed to a side surface of the printed circuit board when the printed circuit board is cut.

When the glass sheet is used as the core material, the printed circuit board is cut into unit printed circuit boards and commercialized after a via hole passing through the core material is formed or the strip type printed circuit board is manufactured. At this time, when a cutting means such as a blade or a wire saw passes through the glass sheet, fine cracks or chipping may occur on the cut surface, and the fine cracks may proceed to the internal cracks of the glass sheet during thermal processing.

SUMMARY

One aspect of the present invention is to overcome the various disadvantages and problems raised in the conventional printed circuit board and to provide a printed circuit board that can prevent a core from being exposed to a side surface of the printed circuit board.

Another aspect of the present invention is to provide a method of manufacturing a printed circuit board that can prevent internal cracks of a core when cutting a panel into unit printed circuit boards during manufacture of the printed circuit board.

In accordance with one aspect of the present invention, there is provided a printed circuit board including: a core made of a glass material; an insulator for surrounding the entire outer peripheral surface including a side surface of the core; an internal circuit layer formed on the insulator; and a via for connecting the internal circuit layers through the core and the insulator.

A build-up layer may be further formed on the insulator, and the printed circuit board may further include an external circuit layer patterned on the build-up layer; and a solder resist layer covered on a region of the build-up layer except an opening which exposes a pattern portion of the external circuit layer, wherein the external circuit layer may be electrically connected to the internal circuit layer through an interlayer via formed in the build-up layer.

The insulator may be formed to have a thickness of less than about 25 μm from the core to the internal circuit layer, and the insulator may be formed by impregnating one of fabric cloth and glass cloth with a resin composition of resin or epoxy.

In accordance with another aspect of the present invention, there is provided a printed circuit board including: a core made of a glass material and having a through hole formed therein; an insulator for surrounding the entire outer peripheral surface including a side surface of the core and formed on an inner wall of the through hole; and a via formed in the insulator and formed by plating the through hole with a conductive material.

The core may have a circuit patterned thereon, a build-up layer may be further formed on the insulator, and the printed circuit board may further include an external circuit layer patterned on the build-up layer; and a solder resist layer covered on a region of the build-up layer except an opening which exposes a pattern portion of the external circuit layer, wherein the external circuit layer may be electrically connected to the internal circuit layer through an interlayer via formed in the build-up layer.

The insulator may be formed to have a thickness of less than about 25 μm from the core to the internal circuit layer.

Further, the build-up layer may have a glass reinforcing member inserted therein, the solder resist layer may have a glass reinforcing member embedded therein, and a side surface of the reinforcing member may be surrounded by the insulator and the solder resist layer.

Meanwhile, in accordance with another aspect of the present invention, there is provided a method of manufacturing a printed circuit board, which includes the steps of: preparing a carrier; laminating a first insulator on the carrier; laminating a glass sheet on the first insulator; forming a plurality of slits on both sides of a dam formed in the glass sheet; laminating a second insulator on the glass sheet; separating a core substrate, which uses the glass sheet as a core, from the carrier; forming a via hole through the core of the core substrate; forming a plating layer in the via hole and on an insulator consisting of the first insulator and the second insulator; forming an internal circuit layer and a via by patterning the plating layer and electrically connecting the internal circuit layers through the via; and cutting the core substrate along a dicing line passing through the dam formed in the glass sheet.

In accordance with another aspect of the present invention, there is provided a method of manufacturing a printed circuit board, which includes the steps of: preparing a carrier; preparing a first insulator having a glass sheet laminated thereon; forming a plurality of slits on both sides of a dam formed in the glass sheet; laminating a second insulator on the carrier; laminating the first insulator having the glass sheet laminated thereon on the second insulator so that the glass sheet is embedded in the second insulator; separating a core substrate, which uses the glass sheet as a core, from the carrier; forming a via hole through the core of the core substrate; forming a plating layer in the via hole and on an insulator consisting of the first insulator and the second insulator; forming an internal circuit layer and a via by patterning the plating layer and electrically connecting the internal circuit layers through the via; and cutting the core substrate along a dicing line passing through the dam formed in the glass sheet.

In accordance with another aspect of the present invention, a printed circuit board includes: a core made of a glass material and having a through hole; an insulator formed on top, bottom, and all lateral sides of the core; and a via in the through hole passing through the core and the insulator, the via electrically connecting between circuit layers on opposite sides of the core. Such circuit board may be produced by a method including forming two sets of slits in a glass sheet, each set of slits having two slits that define a dam comprised of an uncut portion of the glass sheet located between the two slits; coupling an insulating member to the glass sheet such that a portion of the insulating member is on the dam and another portion of the insulating member fills into the slits between two dams, the insulating member and the glass sheet collectively forming a substrate; and cutting the substrate along dicing lines passing respectively through the two dams.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 5A shows an embodiment in which a reinforcing member is embedded in an insulator; FIG. 5B shows an embodiment in which a reinforcing member is embedded in a solder resist layer;

FIGS. 6 through 17 are process cross-sectional views showing a method of manufacturing a printed circuit board in accordance with an embodiment of the present invention, wherein FIG. 6 is a cross-sectional view of a carrier employed in manufacture of a printed circuit board of the present embodiment, FIGS. 7 and 8 are cross-sectional views showing the state in which an insulator and a glass sheet are laminated on an outer peripheral surface of the carrier, FIG. 9 is a cross-sectional view showing the state in which a slit is processed in the glass sheet, FIG. 10 is a cross-sectional view showing the state in which a second insulator is laminated on the glass sheet, FIGS. 11 through 13 are cross-sectional views showing a core substrate separated from the carrier, FIGS. 14 and 15 are cross-sectional views showing the state in which a build-up layer and a solder resist layer are laminated, FIG. 16 is a cross-sectional view showing the state in which an electronic component is mounted on the build-up printed circuit board, and FIG. 17 is a cross-sectional view showing the state in which the array printed circuit board of FIG. 16 is cut into unit printed circuit boards;

FIGS. 19 through 30 are process cross-sectional views showing a method of manufacturing a printed circuit board in accordance with another embodiment of the present invention, wherein FIG. 19 is a cross-sectional view of a carrier employed in manufacture of a printed circuit board of the present embodiment, FIGS. 20 and 21 are cross-sectional views showing the state in which a glass sheet is laminated on an insulator, FIG. 22 is a cross-sectional view showing the state in which a second insulator is laminated on the carrier, FIG. 23 is a cross-sectional view showing the state in which the glass sheet is embedded in the second insulator, FIGS. 24 through 26 are cross-sectional views showing a core substrate separated from the carrier, FIGS. 27 and 28 are cross-sectional views showing the state in which a build-up layer and a solder resist layer are laminated, FIG. 29 is a cross-sectional view showing the state in which an electronic component is mounted on the build-up printed circuit board, and FIG. 30 is a cross-sectional view showing the state in which the array printed circuit board of FIG. 29 is cut into unit printed circuit boards.

DESCRIPTION OF EMBODIMENTS

Various aspects of a printed circuit board and a method of manufacturing the same in accordance with the present invention will be clearly appreciated through the following description with reference to the accompanying drawings showing embodiments of the present invention.

An Embodiment of a Printed Circuit Board

Figure 1:
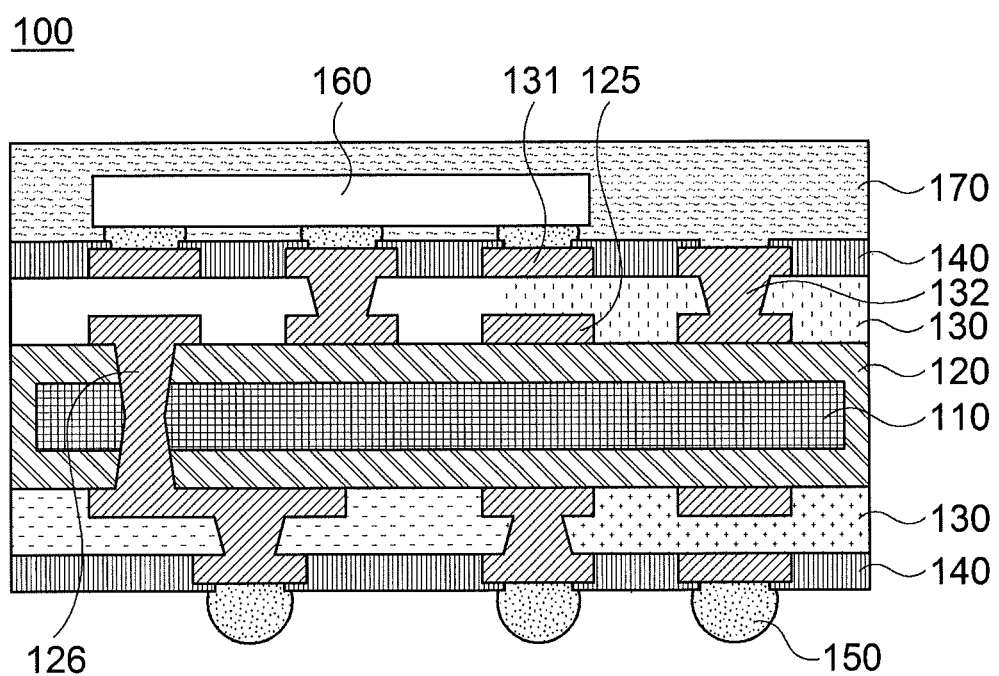
FIG. 1 is a cross-sectional view of a printed circuit board in accordance with an embodiment of the present invention.
Figure 2:
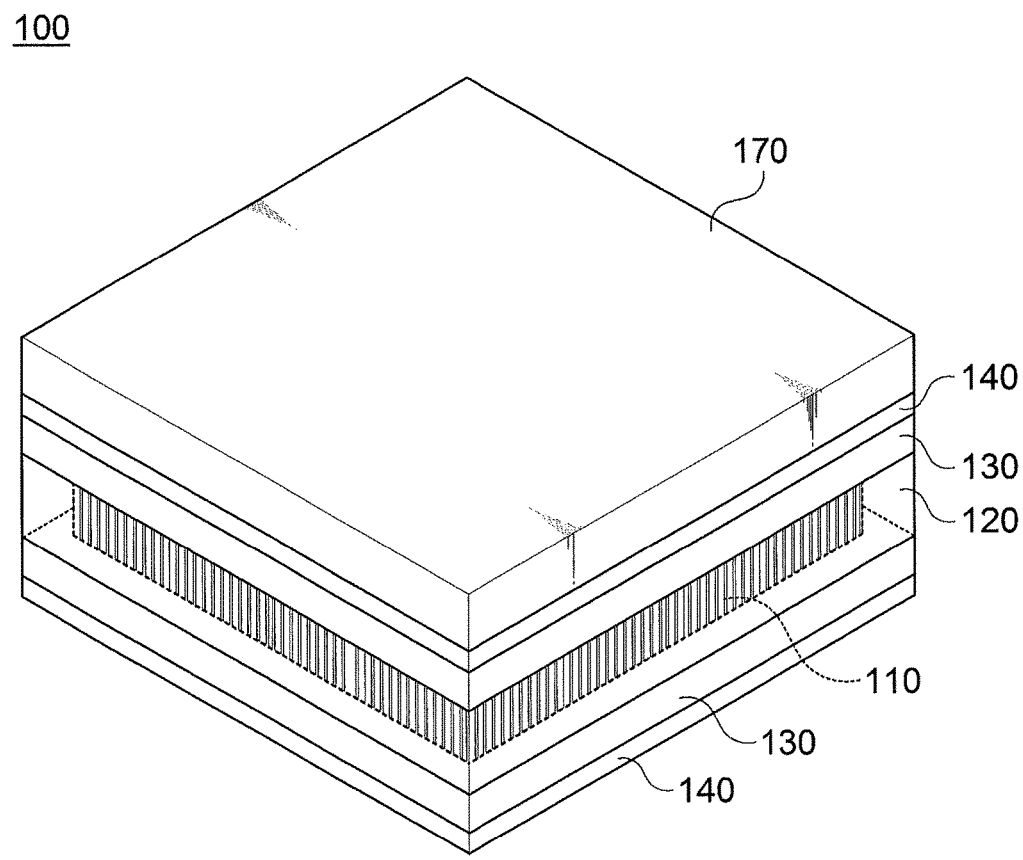
FIG. 2 is a perspective view of the printed circuit board in accordance with an embodiment of the present invention.

First, FIG. 1 is a cross-sectional view of a printed circuit board in accordance with an embodiment of the present invention, and FIG. 2 is a perspective view of the printed circuit board in accordance with an embodiment of the present invention.

As shown, a printed circuit board 100 according to the present invention may include a core 110 made of a glass material, an insulator 120 surrounding side surfaces and upper and lower surfaces of the core 110, an internal circuit layer 125 formed on the insulator 120, and a via 126 for connecting the internal circuit layers 125.

Further, a build-up layer 130 may be further formed on the insulator 120, and an external circuit layer 131 may be patterned on the build-up layer 130 to be electrically connected to the internal circuit layer 125. At this time, when the insulator 120 surrounding the side surface of the core 110 is designated as a first insulating layer, the build-up layer 130 may be designated as a second insulating layer. And the external circuit layer 131 formed on the build-up layer 130 may be electrically connected to the internal circuit layer 125 through an interlayer via 132.

A solder resist layer 140 may be covering the build-up layer 130 to protect the outermost layer of the printed circuit board. A pattern portion of the external circuit layer 131 may be exposed to the outside through an opening of the solder resist layer 140.

The build-up layer 130 may consist of a plurality of insulating layers such as a third insulating layer and a fourth insulating layer, according to the design specifications and intended use of the printed circuit board, in addition to the lamination of the insulating layer designated as the second insulating layer. Therefore, the printed circuit board 100 of the present embodiment may be formed of a multilayer printed circuit board according to the lamination number of the build-up layer 130.

Meanwhile, the core 110, which forms a center portion of the printed circuit board 100, may comprise or consist of a glass sheet. Since the glass sheet forming the core 110 has a thickness of about 25 μm to about 200 μm, it is possible to prevent warpage over a predetermined angle by the modulus of the glass sheet when laminating the insulator 120 and the build-up layer 130 on the top and bottom of the core 110.

That is, when the core 110 of the printed circuit board 100 is made of a resin composition, such as resin or epoxy, equal or similar to those of the insulator 120 and the build-up layer 130, excessive warpage may occur in a concave or convex direction by the heat and pressure applied during the lamination process of the printed circuit board. In order to prevent this, fabric cloth or glass cloth can be impregnated into the resin composition, which forms the core 110, to increase the modulus, thereby preventing the warpage.

However, the printed circuit board 100 of the present embodiment may apply the glass core 100 to reduce the coefficient of thermal expansion (CTE) of the core 110 and increase the modulus, thereby significantly reducing the occurrence of warpage during the lamination of the insulators. This is because the glass core 110 can have a sufficient modulus and a low CTE compared to the resin composition while being thin so that it is possible to manufacture a thin printed circuit board while preventing the warpage during a manufacturing process of the printed circuit board.

The insulator 120 may be laminated on an outer peripheral surface of the core 110. The insulator 120 may be formed with a predetermined thickness, preferably with a small thickness of about 25 μm or less to surround the entire outer peripheral surface including the upper and lower surfaces as well as the (lateral) side surfaces of the core 110.

Further, the insulator 120 may have a structure in which fabric cloth or glass cloth is impregnated with a resin composition, such as a resin or epoxy. Inorganic fillers such as nanowires may be further included to add the modulus.

Like this, by surrounding the entire outer peripheral surface of the core 110 with the insulator 120, the core 110 may not be exposed outside the insulator 120. At this time, in order to prevent the outer peripheral surface of the core 110, particularly the side surface of the core 110 from being exposed outside the insulator 120, the side surface of the core 110 may be cut in advance, and the insulator 120 may be filling in the cut position and then be diced to prevent the core 110 from being exposed outside the insulator 120. That is, since the cutting device or apparatus does not touch the side surface of the core 110, the occurrence of fine cracks or chipping on the side surface of the glass core 110 can be prevented. This will be described in more detail when describing a method of manufacturing the printed circuit board of the present embodiment below.

The internal circuit layer 125 may be formed on the insulator 120, and the internal circuit layers 125 formed on the insulator 120 may be electrically connected through the via 126 passing through the insulator 120 and the core 110. The via 126 may be formed in the shape of a through hole by processing via holes in the top and bottom of the insulator 120, respectively, and a plating layer may be filling in the via hole during the formation of the plating layer for forming the internal circuit layer 125 to be used as an electrical connection means.

Meanwhile, the build-up layer 130 may be further formed on the insulator 120. The build-up layer 130 may have a structure in which fabric cloth or glass cloth is impregnated with a resin composition like the insulator 120 and may be formed to have a thickness equal to or larger than that of the insulator 120. And the external circuit layer 131 may be formed on the build-up layer 130 like the insulator 120. The external circuit layer 131 may be electrically connected to the internal circuit layer 125 provided on the insulator 120 through the interlayer via 132 formed through the build-up layer 130.

At this time, since the build-up layer 130 may consist of a plurality of insulating layers as described above, when the insulator 120 is designated as a first insulating layer, the build-up layer 130 may consist of a second insulating layer or a plurality of insulating layers such as a third insulating layer and a fourth insulating layer sequentially laminated on the second insulating layer according to the circuit pattern design of the printed circuit board. Further, when the build-up layer 130 consists of a plurality of insulating layers, the external circuit layer 131, which is electrically connected to the internal circuit layer 125 through the interlayer via 132, may be patterned on each insulating layer which forms the build-up layer 130.

The solder resist layer 140 may be formed on the outermost layer of the printed circuit board 100 having the build-up layer 130 and covered on a region except the exposed region of the external circuit layer 131 through the opening to protect an outer layer surface of the printed circuit board 100.

The printed circuit board 100 of the present embodiment configured as above may mount an active element such as a semiconductor chip or IC or selectively mount an electronic component 160 including a passive element such as Multi-Layer Ceramic Capacitor (MLCC) or Low-Temperature Co-fired Ceramics (LTCC) elements on an upper surface thereof. In addition, since the active element and the passive element may be mounted at the same time, the elements may be mounted in a stacked structure or mounted to be arranged in parallel. A molding portion 170 may be configured on the top of the printed circuit board 100 to protect the electronic component 160 from the outside by surrounding the electronic component 160.

A connection member 150 such as a solder ball may be coupled on the bottom of the printed circuit board 100 to make electrical connection with an external device.

Another Embodiment of a Printed Circuit Board

Figure 3:
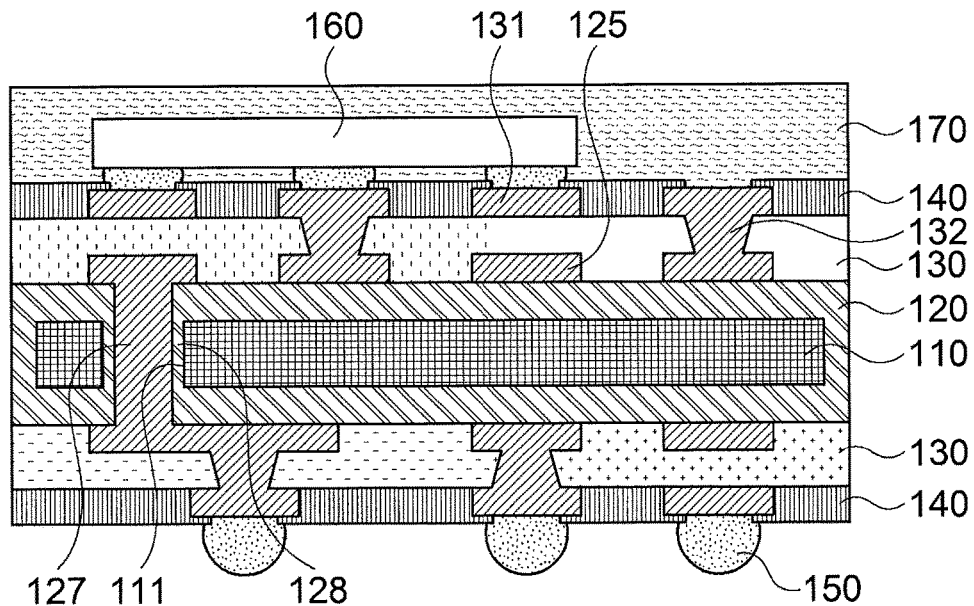
FIG. 3 is a cross-sectional view of a printed circuit board in accordance with another embodiment of the present invention.

Meanwhile, FIG. 3 is a cross-sectional view of a printed circuit board in accordance with another embodiment of the present invention.

As shown, a printed circuit board 200 of the present embodiment may include a core 110 made of a glass material and an insulator 120 surrounding an outer peripheral surface of the core 110, wherein a through hole 111 for electrically connecting internal circuit layers 125 formed on the insulator 120 may be formed in the core 110, and the internal circuit layers 125 may be electrically connected through a plating layer 127 filled in the through hole 111.

At this time, the plating layer 127 for electrically connecting the internal circuit layers 125 may be filling in the through hole 111. The plating layer 127 may be filling the through hole with an insulator 128 interposed between the plating layer 127 and the through hole, without the plating layer 127 being in direct contact with an inner wall of the through hole 111.

This arrangement is to prevent the internal cracks of the glass core 110 when forming the through hole 111 for filling the plating layer 127 therein. In more detail, when the insulator 120 is formed to surround the entire outer peripheral surface including a side surface of the core 110 and the through holes 111 are formed in the top and bottom of the insulator 120 as in the embodiment of FIG. 1, cracks may occur in the through hole 111 processing portion due to the characteristics of the glass material.

In order to prevent the cracks of the core 110, the slit-shaped through hole 111 may be previously formed before the insulator 120 is laminated on the core 110, and the insulator 120 may be laminated to surround the entire outer peripheral surface of the core 110. The through hole 111 formed in the core 110 before the lamination of the insulator 120 may be processed at the same time when the side surface of the core 110 is processed, and the side surface of the core 110 and the through hole 111 may be processed by performing etching or by sequentially performing laser processing and etching. The method of processing the core 110 will be described in more detail through the following method of manufacturing a printed circuit board.

Further, in the printed circuit board 200 of the present embodiment, the insulator may be filling in the through hole 111, which is previously formed in the core 110, during the formation of the insulator 120 which surrounds the entire outer peripheral surface including the side surface of the core 110. The insulator filled in the through hole 111 may be removed by drilling or laser processing, and the plating layer 127 may be filling in the through hole 111, from which the insulator is removed, to be used as an electrical connection means of the internal circuit layer 125.

At this time, preferably, the insulator filled in the through hole 111 is processed to remain on the inner wall of the through hole 111 with a predetermined thickness, and the plating layer 127 filled in the through hole 111 may be present so as to be closely adhered to the insulator remaining on the inner wall.

Therefore, the printed circuit board 200 of the present embodiment can prevent the internal cracks of the core 110 by preventing a physical cutting means, which passes through the insulator 120, from being in contact with the core 110 when processing the through hole 111 on the insulator 120 surrounding the core 110.

A build-up layer 130 and a solder resist layer 140 may be sequentially laminated on the insulator 120 as in the embodiment of FIG. 1, and repeated descriptions of the same elements as those of the embodiment described through FIG. 1 other than the elements described in the present embodiment will be omitted.

Another Embodiment of a Printed Circuit Board

Figure 4:
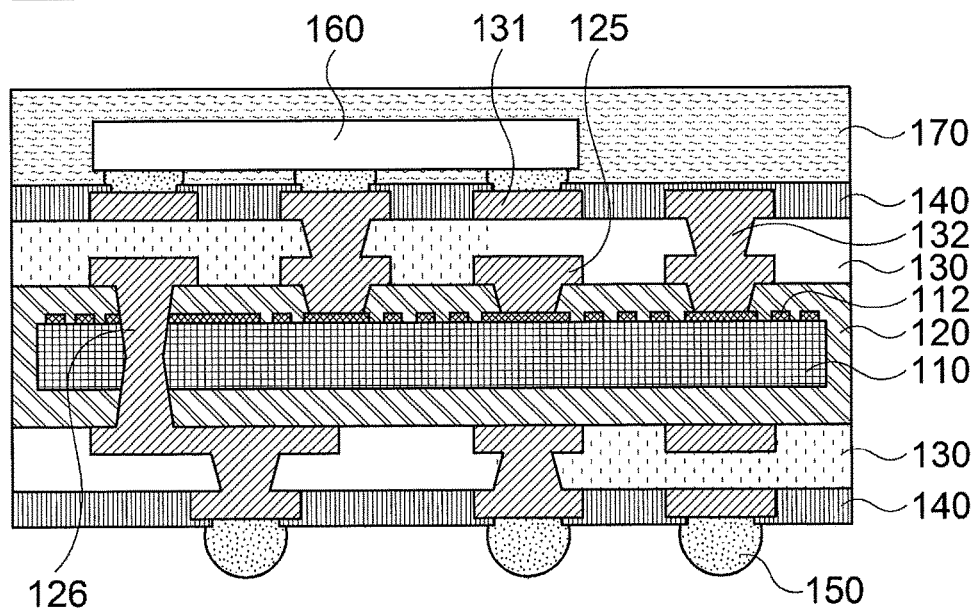
FIG. 4 is a cross-sectional view of a printed circuit board in accordance with another embodiment of the present invention.

Next, FIG. 4 is a cross-sectional view of a printed circuit board in accordance with another embodiment of the present invention. As shown, a printed circuit board 300 of the present embodiment may have a fine pattern circuit 112 formed on one surface of a core 110 made of a glass material.

The printed circuit board 300 of the present embodiment may consist of the core 110 made of a glass material and having the fine pattern circuit 112 formed on one surface thereof, an insulator 120 surrounding the entire outer peripheral surface including a side surface of the core 110, a build-up layer 130 formed on the insulator 120, and a solder resist layer 140 covered on the outermost layer of the build-up layer 130. An internal circuit layer 125 and an external circuit layer 131 may be provided on the insulator 120 and the build-up layer 130, respectively, and the internal circuit layer and the external circuit layer may be electrically connected through an interlayer via 132 formed in the build-up layer 130.

Further, the internal circuit layers 125 may be electrically connected through a via 126 formed through the insulator 120 and the core 110.

The fine pattern circuit 132 formed on the core 110 may consist of a typical circuit pattern, and in addition to the circuit pattern, a thin inductor, capacitor, or resistor may be patterned. At this time, the circuit 112 may be electrically connected to the internal circuit layer 125 formed on the insulator 120 through a via, and the insulator 120 having the via may be formed by applying a high dielectric constant insulator. The high dielectric constant insulator may be comprised mainly of one of silicon, carbide, or silicon nitride.

In the printed circuit board of the present embodiment, the same elements as those of the above-described embodiment are represented by the same reference numerals, and descriptions overlapping with those of the embodiment of FIG. 1 will be omitted.

Another Embodiment of a Printed Circuit Board

Figure 5A:
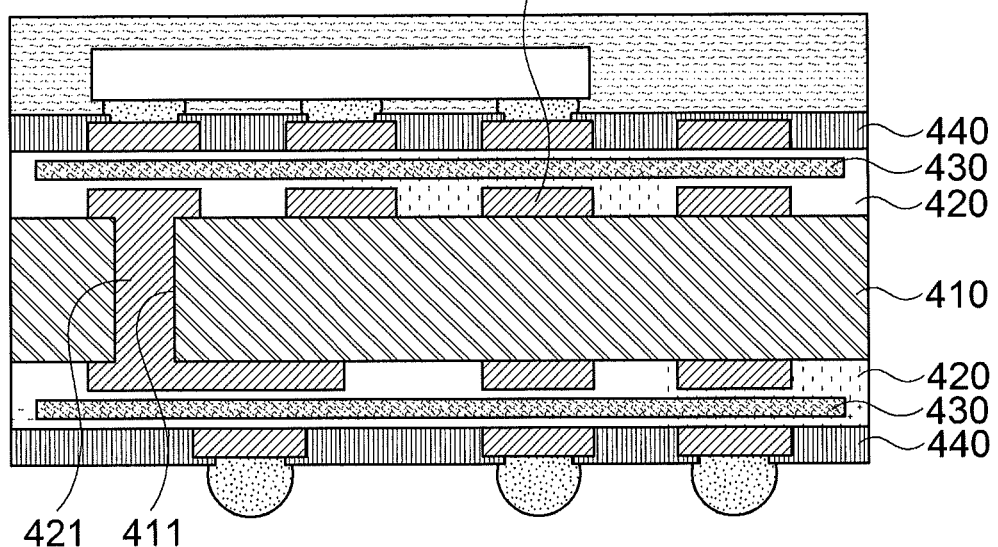
FIGS. 5A and 5B show a perspective view of a printed circuit board in accordance with another embodiment of the present invention.
Figure 5B:
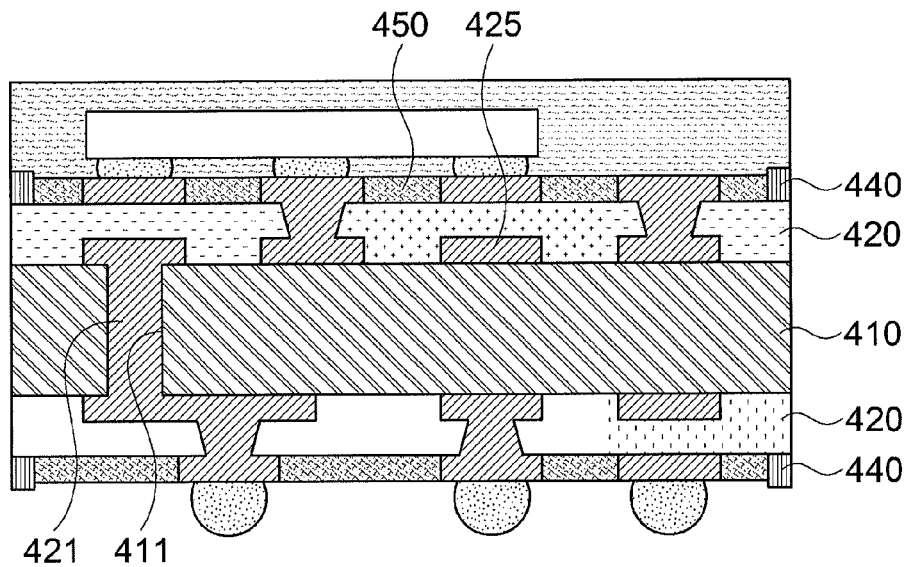

In addition to the embodiments described in FIGS. 1 to 4, in the present invention, a printed circuit board of an embodiment of FIG. 5A-5B may be manufactured. FIG. 5A-5B show a perspective view of a printed circuit board in accordance with another embodiment of the present invention. FIG. 5A shows an embodiment in which a reinforcing member is embedded in an insulator. FIG. 5B shows an embodiment in which a reinforcing member is embedded in a solder resist layer.

A reinforcing member 430 made of a glass material may be inserted into an insulator 420 laminated on a core 410 of a printed circuit board 400 of the present embodiment shown in FIGS. 5A and 5B, and a reinforcing member 450 made of a glass material may be embedded in a solder resist layer 440 which forms the outermost layer of the printed circuit board.

The core 410 and the insulator 420 may be made of an insulating material such as resin or epoxy or a composite insulating material obtained by impregnating fabric cloth or epoxy cloth with inorganic fillers as well as an insulating material. The core 410 may also be constructed in the manner of the cores in the above-mentioned embodiments of FIGS. 1 through 4.

Like the above-described embodiments, an internal circuit layer 425 may be formed on the core 410, and a through hole 411 for electrically connecting the internal circuit layers 425 and a plating layer 421 filled in the through hole 411 may be formed. At this time, the insulator 420 may be laminated on the top and bottom of the core 410. In case of FIG. 5A, when laminating the insulator 420, the glass reinforcing member 430 having a smaller thickness than the insulator 420 may be embedded to improve the modulus of the insulator 420.

Further, in case of FIG. 5B, the insulator 420 may be laminated on the core 410, and a portion of the solder resist layer 440 may be formed of the glass reinforcing member 450 before the solder resist layer 440 is formed on the insulator 420. At this time, side surfaces of the reinforcing members 430 and 450 are preferred not to be exposed to the outside.

The printed circuit board of the present embodiments configured as above can prevent damage to the core or reinforcing member due to external shocks by entirely surrounding the glass core or reinforcing member with the insulator to prevent the side surface of the core or reinforcing member from being exposed to the outside. Further, the present embodiments can prevent fine cracks or scattering of chips on the core by preventing a cutting means from being in direct contact with the glass core when the array printed circuit board is cut into the unit printed circuit boards during the manufacture of the printed circuit board shown in FIGS. 1 to 5. A manufacturing method for preventing the cracks of the core in the present embodiments will be described in detail below.

An Embodiment of a Method of Manufacturing Printed Circuit Board

FIGS. 6 through 17 are process cross-sectional views showing a method of manufacturing a printed circuit board in accordance with an embodiment of the present invention.

Figure 6:
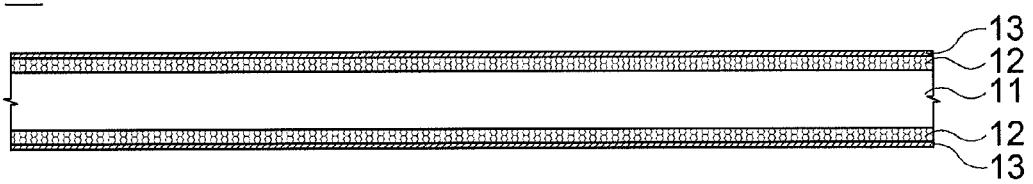

First, FIG. 6 is a cross-sectional view of a carrier employed in manufacture of a printed circuit board of the present embodiment. As shown, in a method of manufacturing a printed circuit board of the present embodiment, a copper clad laminate (CCL) type carrier 10 may be prepared.

The carrier 10 may be a CCL consisting of a PPG insulator 11 and copper foils 12 laminated on the top and bottom of the insulator 11. At this time, in the carrier 10, a thin copper (Cu) exfoliation film 13 may further laminated on the copper foil 12. The exfoliation layer 13 may be laminated with a smaller thickness than the copper foils 12 formed on both surfaces of the carrier 10 and may be a release layer which can be separated from the copper foil 12 in a subsequent process.

Figure 7:
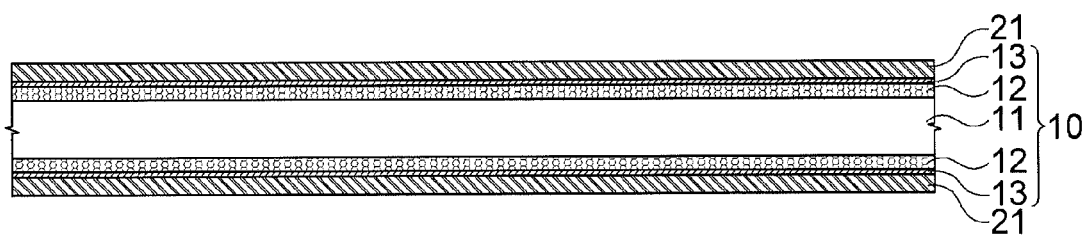
Figure 8:
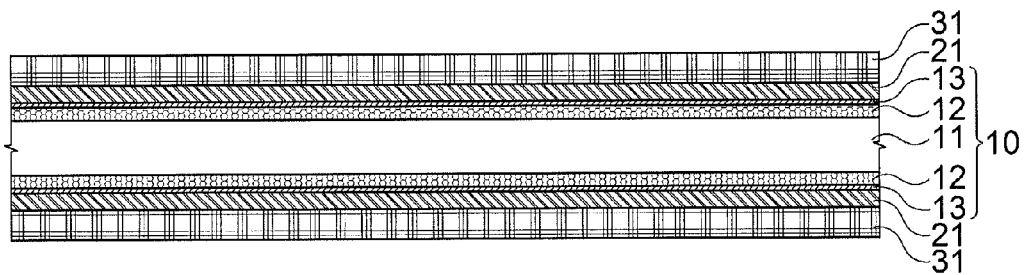

Next, FIGS. 7 and 8 are cross-sectional views showing an insulator and a glass sheet are laminated on an outer peripheral surface of the carrier. As shown, in the present embodiment, a first insulator 21 may be laminated on the carrier 10. The first insulator 21 may be made of an insulating material, which is obtained by mixing glass cloth with a resin material such as resin or epoxy, to have a predetermined modulus against warpage.

The first insulator 21 may be laminated on the exfoliation layers 13 formed on upper and lower surfaces of the carrier 10 to surround all the surfaces of the carrier 10 including the side surface of the carrier 10.

A thin glass sheet 31 may be laminated on the first insulator 21. The glass sheet 31 may be laminated with a thickness of about 25 μm to about 200 μm. The thin glass sheet 31 may be laminated by being cut to a predetermined length or laminated in the form of a glass sheet by being applied to the first insulator 21 in the form of slurry and cured.

Figure 9:
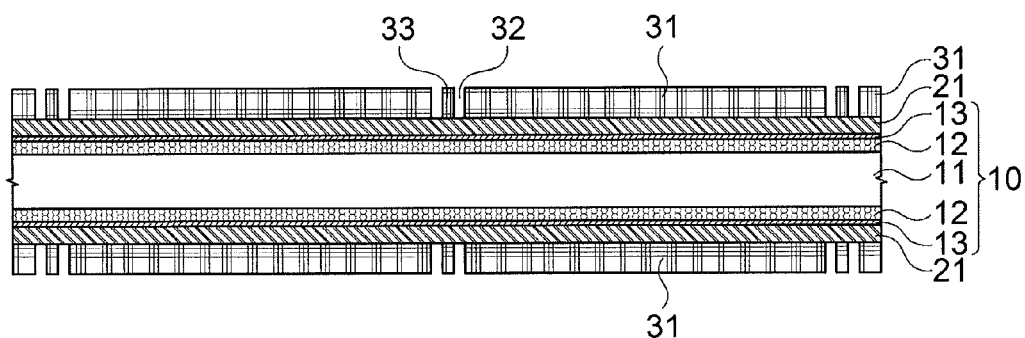

Next, FIG. 9 is a cross-sectional view showing the state in which a slit is processed in the glass sheet. As shown, a plurality of slits 32 may be formed in the glass sheet 31 laminated on the first insulator 21 at predetermined intervals. The plurality of slits 32 may be processed by a mechanical cutting method using a blade, a wire saw, or laser drilling or by a chemical cutting method using etching.

Figure 18:
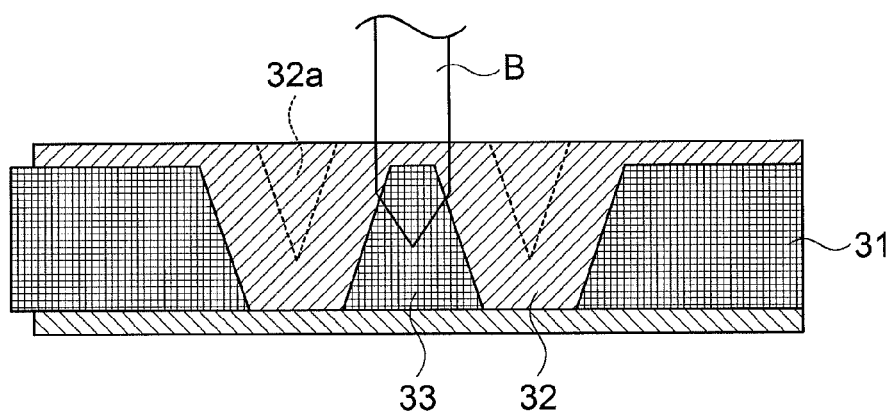
FIG. 18 is a cross-sectional view when the slit is processed in the glass sheet in the method of manufacturing a printed circuit board.

The portion in which the plurality of slits 32 are processed will be described in detail. As shown in FIG. 18, the plurality of slits 32 are provided on both sides of a dam 33. The plurality of slits 32 may be formed by using a mechanical cutting method using laser drilling and a chemical cutting method through an etching process together. That is, a groove 32a may be processed to a predetermined position of the glass sheet 31 using laser, and the slit 32 may be formed in the groove processing portion using an etching process.

When the slits 32 are processed in the glass sheet 31 by a mechanical cutting method, the slit may be formed to have a narrow width during the processing of the slit only by laser irradiation and an etching process may be omitted, but it may be difficult to irradiate laser to an exact position and the dam 33 formed between the slits may be processed to have a large width and thus a portion of the dam 33 may remain in the cut portion when dicing between the slits in a subsequent process. Therefore, the slit 32 is preferred to be processed using a mechanical cutting method by laser drilling and a chemical cutting method by half-etching together.

Here, FIG. 18 is a cross-sectional view showing the state in which the slit is processed in the glass sheet in the method of manufacturing a printed circuit board of the present embodiment.

The slit 32 formed in the glass sheet 31 can prevent a cutting means such as a blade from being in direct contact with the glass sheet 31 when finally dicing the slit forming portion after laminating an insulator and a build-up layer. That is, the cutting means is prevented from being in direct contact with the glass sheet 31, which is used exclusively as a core in a subsequent process, to prevent the occurrence of fine cracks on a side surface of the glass sheet 31, and the exposure of the side surface of the glass sheet 31 is prevented by an insulator 120. Further, the slit 32 is preferred to be processed on the both sides of the dam 33 in plural.

The reason of forming the slit 32 in the glass sheet 31 and the reason of forming the slit 32 in plural will be described in detail in the following processes of forming an insulator and cutting the printed circuit board into unit printed circuit boards.

Figure 10:
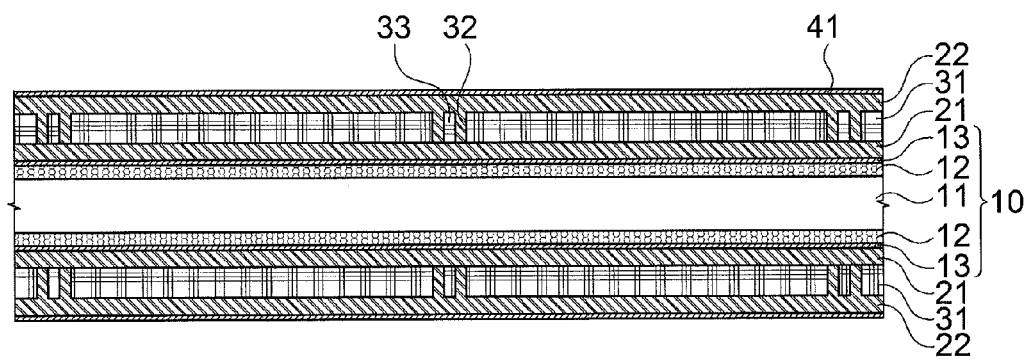

Next, FIG. 10 is a cross-sectional view showing the state in which a second insulator is laminated on the glass sheet.

As shown, in the present embodiment, a second insulator 22 may be laminated on the glass sheet 31 divided by the slit 32. The second insulator 22 may have a structure in which an insulating resin such as resin or epoxy is impregnated in glass cloth for giving a modulus like the first insulator 21 and may be mixed with particulate inorganic fillers.

The second insulator 22 is preferred to be formed with a thickness of about 25 μm or less according to the recent trend of thinning of the printed circuit board when laminated on the glass sheet 31. Further, a thin copper foil 41 may be formed on the second insulator 22. The copper foil 41 may be formed to have a thickness equal/similar to that of the exfoliation layer 13 formed on the carrier 10 and serve as a seed layer for forming a circuit in a subsequent process.

Here, by laminating the second insulator 22 with a small thickness of about 25 μm or less, a filling ratio of the second insulator 22 in the slit 32 can be improved by forming the slit 32 in plural.

That is, in the previous process of forming the slit in the glass sheet 31, the plurality of slits 32 having a width of about 50 μm to about 100 μm are formed on the both sides of the dam 33. If a single slit of about 50 μm to about 100 μm is formed in the glass sheet 31 without the dam 33, since a blade normally has a width of about 100 μm or more, it is impossible to cut only the slit portion when dicing the slit forming portion by the blade and the side surfaces of the adjacent glass sheets 31 may be in contact with each other and damaged. Due to this problem, when the slit is processed in singular, the slit should be processed to have a width of about 200 μm or more considering the thickness of the insulator which surrounds the side surface of the glass sheet 31, but when the second insulator 22 is laminated with a thickness of about 25 μm or less, since the lamination thickness is relatively small, the insulator may not be filled in the slit of about 200 μm or more or voids may be generated on the side surface of the glass sheet 31.

Therefore, the slit 32 between the glass sheets 31 may be formed around the dam 33 in plural to have a width of about 50 μm to about 100 μm so that the second insulator 22 can be completely filled in the slit 32 and the side surface of the glass sheet 31 cannot be in contact with the blade when dicing around the dam in a subsequent process.

Figure 11:
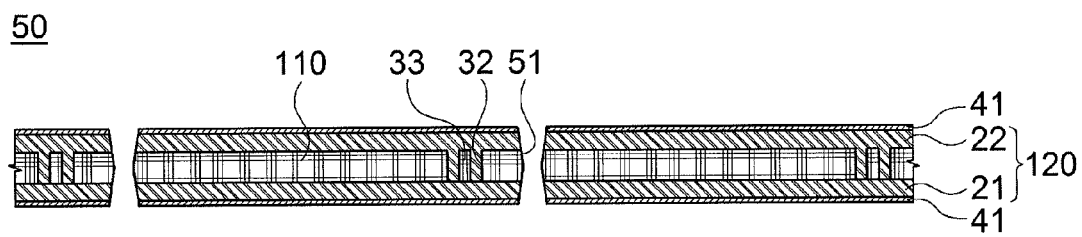
Figure 12:
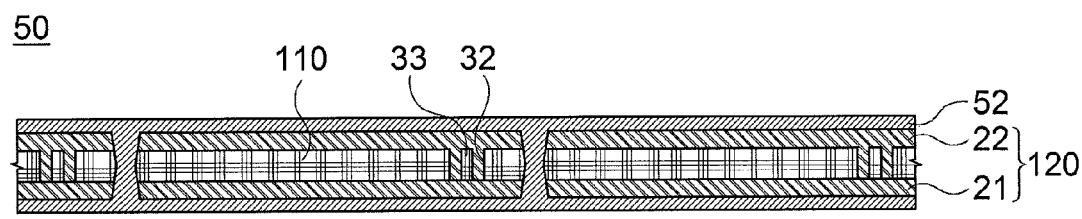
Figure 13:
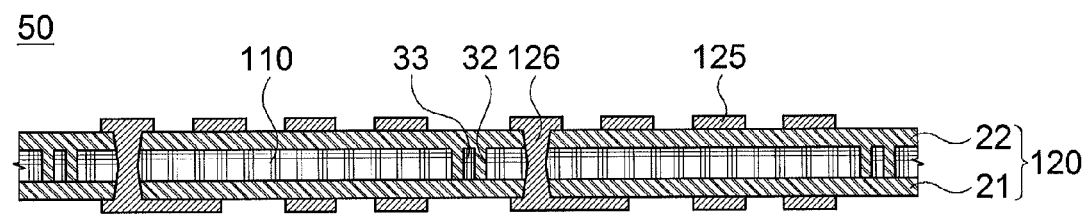

Meanwhile, when the second insulator 22 is laminated on the glass sheet 31, core substrates on both sides of the carrier 10 may be separated. FIGS. 11 to 13 are cross-sectional views showing the core substrate separated from the carrier 10. As shown, in the present embodiment, the core substrates 50 may be separated from the both sides of the carrier 10, and an individual build-up process may be performed on each core substrate 50.

The core substrates 50 may be separated through the exfoliation layers 13 laminated on the both sides of the carrier 10, and the copper foil formed on the exfoliation layer 13 and the second insulator 22 may function as a seed layer of the core substrate 50.

Further, the core substrate 50 may consist of the insulator 120 in which the first insulator 21 and the second insulator 22 laminated on the top and bottom of the glass sheet 31 divided by the plurality of slits 32 surround the glass sheet 31, and the glass sheet 31 in the insulator 120 may function as a core having a modulus. In a subsequent process, the glass sheet 31 will be designated as a core 110, and the first insulator 21 and the second insulator 22 will be designated as the insulator 120.

The core substrate 50 may have a via hole 51 which passes through the insulator 120 and the core 110. The via hole 51 may be formed in the top and bottom of the core substrate 50 to have a sandglass shape and may be formed by laser drilling or CNC drilling.

After that, a plating layer 52 may be formed on the seed layer including the via hole 51 formed in the core substrate 50 to configure a via 126 filled with the plating layer 52, and an internal circuit layer 125 may be formed by patterning the plating layer 52 by etching. At this time, the internal circuit layer 125 may be formed by a tenting or subtractive method. Hereinafter, since the patterning method like this is a well-known technique, a detailed description of a method of forming a circuit layer will be omitted.

Figure 14:
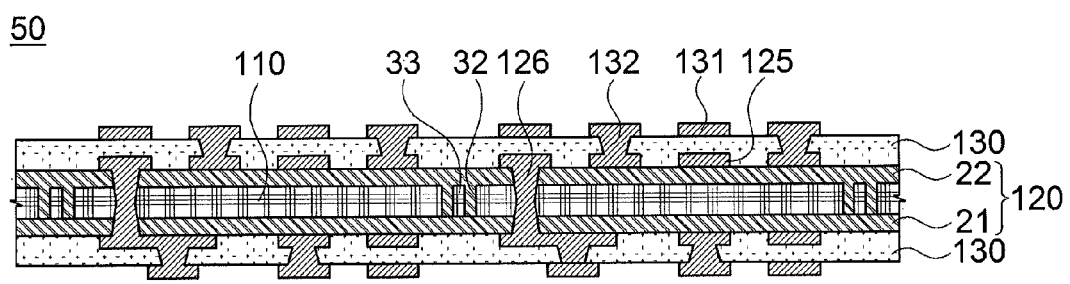
Figure 15:
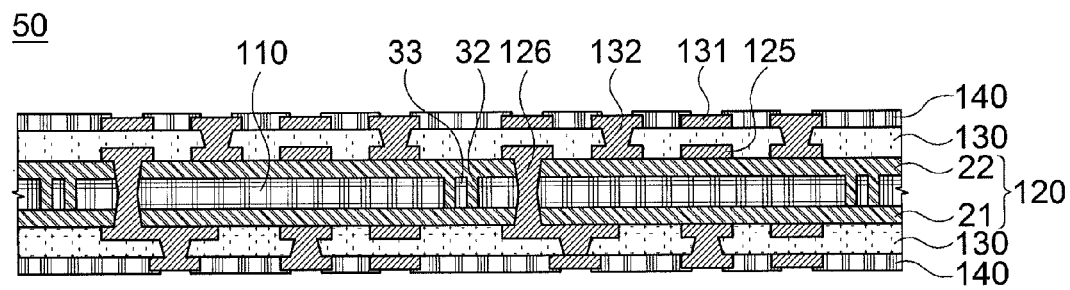

Next, FIGS. 14 and 15 are cross-sectional views showing the state in which a build-up layer and a solder resist layer are laminated. As shown, in the present embodiment, build-up layers 130 may be laminated on the top and bottom of the core substrate 50, respectively, and a plating layer may be formed on the build-up layer 130 including a via hole after forming the via hole in the build-up layer 130. At this time, before forming the plating layer, a thin metal seed layer may be formed to form the plating layer based on the seed layer, and the plating layer may be etched to be configured as an external circuit layer 131. The external circuit layer 131 may be formed by a tenting or subtractive method like the internal circuit layer 125. And the external circuit layer 131 and the internal circuit layer 125 may be electrically connected through an interlayer via 132 formed in the build-up layer 130.

Meanwhile, as shown in FIG. 15, a solder resist layer 140 may be laminated on the build-up layer 130 to cover a region except the region of the external circuit layer 131 exposed through an opening. The solder resist layer 140 may be formed on the outermost layer of the insulator which forms the build-up layer 130 to protect the region except the external circuit layer 131 exposed to the outside from an external environment.

Figure 16:
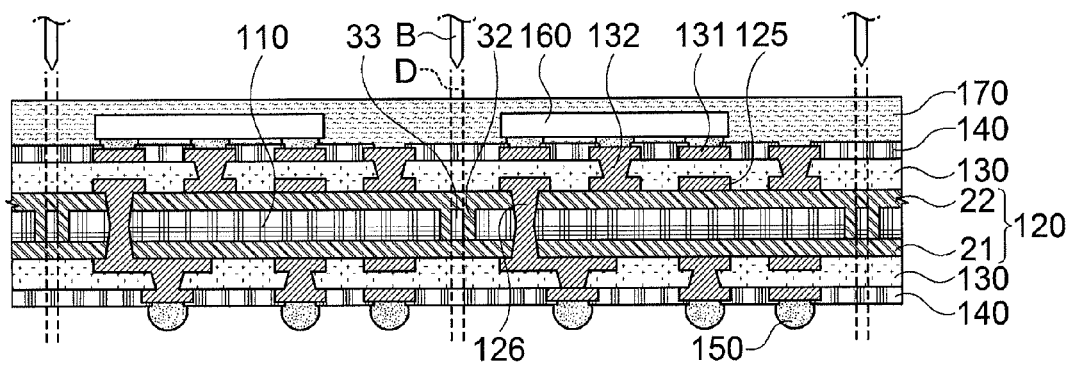
Figure 17:
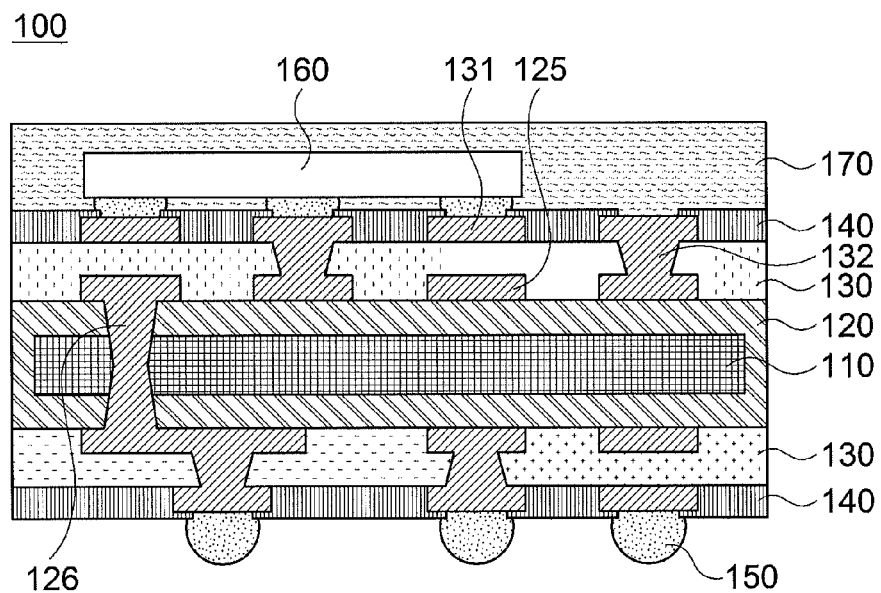

Next, FIG. 16 is a cross-sectional view showing the state in which an electronic component is mounted on the build-up printed circuit board, and FIG. 17 is a cross-sectional view showing the state in which the array printed circuit board of FIG. 16 is cut into unit printed circuit boards.

As shown, in the printed circuit board of the present embodiment, after the insulator 120 and the build-up layer 130 are laminated on the core substrate 50, an electronic component 160 may be mounted on one surface of the printed circuit board by soldering. Further, a connection means 150 such as a solder ball may be coupled to the opposite surface of the surface on which the electronic component 160 is mounted. The connection means 150 may function as an electrical connection means when the printed circuit board 100 of the present embodiment is mounted on a main board.

Further, a molding portion 170 may be formed on the printed circuit board 100 to surround an outer peripheral surface of the electronic component 160. The molding portion 170 may be mainly an EMC molding material of an epoxy material and integrally formed on the printed circuit board 100 to be configured in the form of a package.

Next, when the electronic component is mounted on the printed circuit board 100 and the molding process is completed, the array printed circuit board may be cut into unit printed circuit boards along a dicing line D. Typically, the cutting of the printed circuit board 100 may be performed by a cutting means B such as a blade, and the molding portion 170 and the printed circuit board 100 may be cut at the same time to configure the unit printed circuit board of FIG. 17.

At this time, when cutting into the unit printed circuit boards using the cutting means B, the cutting may be performed through the slit 32 portion formed in the core 110 of the printed circuit board 100, and the insulator 120 may be cut around the dam 33 formed between the plurality of slits 32 to prevent a blade as the cutting means B from being in contact with a side surface of the core 110. Accordingly, stress generated during the cutting of the printed circuit board cannot be transmitted to the core 110 to prevent breakage or fine cracks of the core 110 in the printed circuit board.

Further, since the blade as the cutting means B passes through the dam 33 of the slit 32 forming portion, the unit printed circuit board 100 may be cut in a state in which the insulator 120 is covered on the side surface of the core 110 to prevent exposure of the side surface of the core 110.

Another Embodiment of a Method of Manufacturing Printed Circuit Board

FIGS. 19 through 30 are process cross-sectional views showing a method of manufacturing a printed circuit board in accordance with another embodiment of the present invention.

Figure 19:
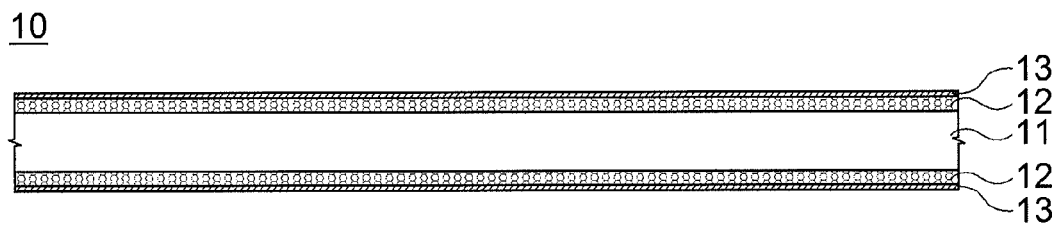

First, FIG. 19 is a cross-sectional view of a carrier employed in manufacture of a printed circuit board of the present embodiment. As shown, in the present embodiment, a carrier 10 may be prepared. The carrier 10 may be a CCL and formed by laminating exfoliation layers 13, which are metal film thinner than copper foils 12, on the copper foils 12 laminated on the top and bottom of a PPG insulator 11. The exfoliation layer 13 may be a release layer that can be separated from the copper foil 12 in a subsequent process.

Figure 20:
Figure 21:
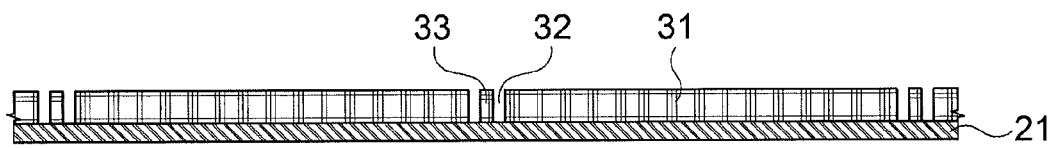

Next, FIGS. 20 and 21 are cross-sectional views showing the state in which a glass sheet is laminated on the insulator. As shown, in the present embodiment, a glass sheet 31 may be laminated on a plate insulator 21 to have a thickness of about 25 μm to about 200 μm. The insulator 21 may be designated as a first insulator and made of an insulating material obtained by mixing glass cloth with a resin material such as resin or epoxy to have a predetermined modulus against warpage.

Further, a plurality of slits 32 may be formed in the glass sheet 31 laminated on the first insulator 21 at predetermined intervals. The plurality of slits 32 may be processed by a mechanical cutting method using a blade, a wire saw, or laser drilling or by a chemical cutting method using etching like the above embodiment or formed by using a mechanical cutting method using laser drilling and a chemical cutting method through an etching process together. Accordingly, the plurality of slits 32 can be formed on both sides of a dam 33. Here, since the reason of forming the slit 32 and the reason of forming the slit 32 in plural are the same as those mentioned in the detailed description of the above embodiment and the process of forming the slit is also the same as that of the above embodiment, repeated detailed descriptions will be omitted.

Meanwhile, in FIGS. 20 and 21, the first insulator 21 may be a dummy panel type film having an adhesive layer on one surface thereof. The film may perform the role of supporting the glass sheet 31 and may be made of a resin material without a glass cloth core having a modulus inside thereof. Further, the adhesive layer provided on one surface of the film may be made of a detachable release material to remove the glass sheet 31 fixed to the carrier 10 through the adhesive layer.

Figure 22:
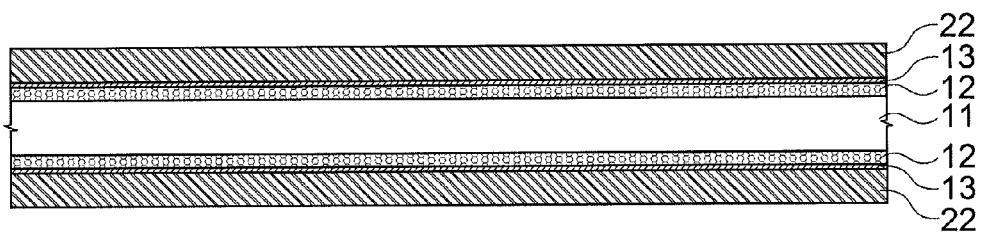
Figure 23:
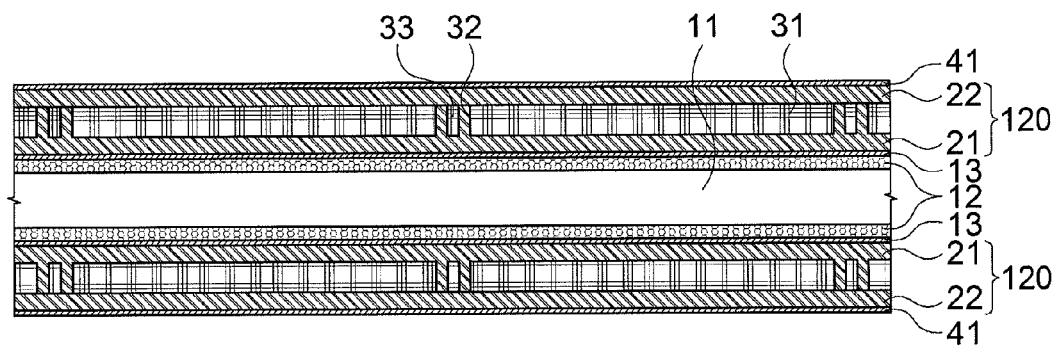

Next, FIG. 22 is a cross-sectional view showing the state in which a second insulator is laminated on the carrier, and FIG. 23 is a cross-sectional view showing the state in which the glass sheet is embedded in the second insulator.

As shown, in the present embodiment, the second insulator 22 may be laminated on upper and lower surfaces of the carrier 10 shown in FIG. 19 with a predetermined thickness. The second insulator 22 may have a structure in which an insulating resin such as resin or epoxy is impregnated in glass fiber for giving a modulus and may be mixed with particulate inorganic fillers.

The glass sheet 31 laminated on the first insulator 21 may be coupled to be embedded in the second insulator 22 laminated on the carrier 10. At this time, the lamination thickness of the second insulator 22 is preferred to maintain an interlayer thickness t from an upper surface of the glass sheet 31 to the exfoliation layer 13 at about 25 μm or less when the glass sheet 31 is embedded.

Further, as described above, when the first insulator 21 is a dummy panel type film, the film may be removed after the glass sheet 31 is embedded in the second insulator 22. In this case, a process of laminating the first insulator 21 of the same material as the second insulator 22 may be further added.

Like this, the glass sheet 31 may be embedded in the second insulator 22 laminated on the carrier 10 to have a structure surrounded by the first insulator 21 and the second insulator 22.

And a copper foil 41, which is the same metal thin film as the exfoliation layer 13, may be laminated on the first insulator 21 formed on the carrier 10. The copper foil 41 may function as a seed layer.

Figure 24:
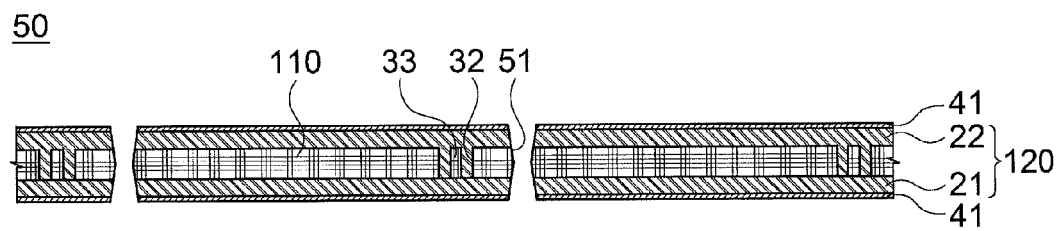
Figure 25:
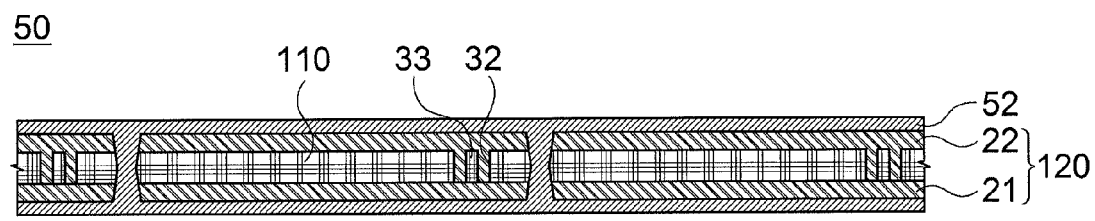
Figure 26:
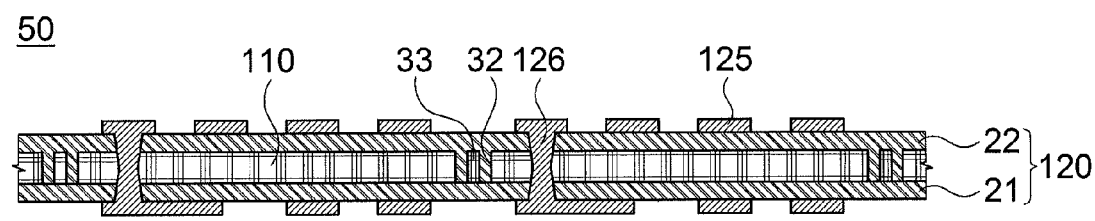

Next, FIGS. 24 to 26 are cross-sectional views showing a core substrate separated from the carrier. In the present embodiment, core substrates 50 may be separated from both sides of the carrier 10, and an individual build-up process may be performed on each core substrate 50.

The core substrate 50 may consist of an insulator 120 in which the first insulator 21 and the second insulator 22 laminated on the top and bottom of the glass sheet 31 divided by the plurality of slits 32 surround the glass sheet 31, and the glass sheet 31 in the insulator 120 may function as a core having a modulus. In a subsequent process, the glass sheet 31 will be designated as a core 110, and both of the first insulator 21 and the second insulator 22 will be designated as the insulator 120.

The core substrate 50 may have a via hole 51 formed through the insulator 120 and the core 110. The via hole 51 may be formed in the top and bottom of the core substrate 50 to have a sandglass shape and formed by laser drilling or CNC drilling.

After that, a plating layer 52 may be formed on the seed layer including the via hole 51 formed in the core substrate 50, and an internal circuit layer 125 may be formed by patterning the plating layer 52 by etching. At this time, the internal circuit layer 125 may be formed by a tenting or subtractive method. Hereinafter, a description of a detailed method of forming a circuit layer will be omitted since the patterning method like this is a well-known technique.

Figure 27:
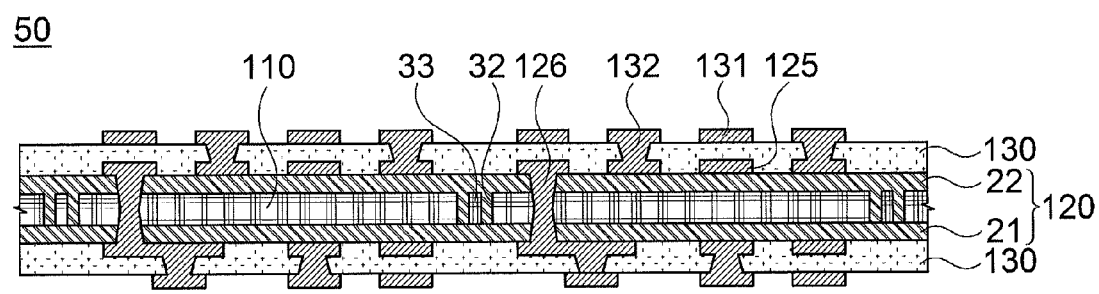
Figure 28:
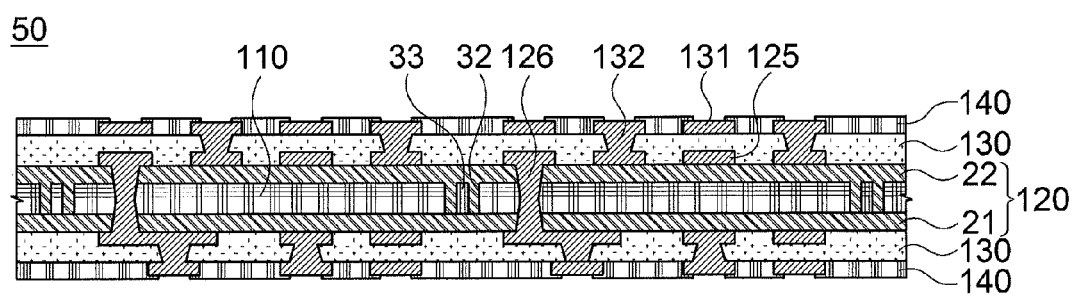

Next, FIGS. 27 and 28 are cross-sectional views showing the state in which a build-up layer and a solder resist layer are laminated. As shown, in the present embodiment, build-up layers 130 may be laminated on the top and bottom of the core substrate 50, respectively, and the plating layer 52 may be formed on the build-up layer 130 including a via hole after forming the via hole in the build-up layer 130. At this time, before forming the plating layer, a thin metal seed layer may be formed to form the plating layer based on the seed layer, and the plating layer may be etched to be configured as an external circuit layer 131. The external circuit layer 131 may be formed by a tenting or subtractive method like the internal circuit layer 125. And the external circuit layer 131 and the internal circuit layer 125 may be electrically connected through an interlayer via 132 formed in the build-up layer 130.

Meanwhile, as shown in FIG. 28, a solder resist layer 140 may be laminated on the build-up layer 130 to cover a region except the region of the external circuit layer 131 exposed through an opening. The solder resist layer 140 may be formed on the outermost layer of the insulator which forms the build-up layer 130 to protect the region except the external circuit layer 131 exposed to the outside from an external environment.

Figure 29:
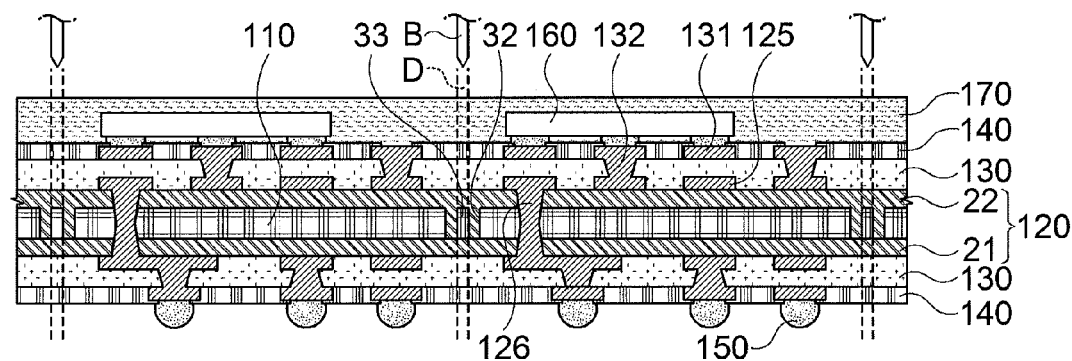
Figure 30:
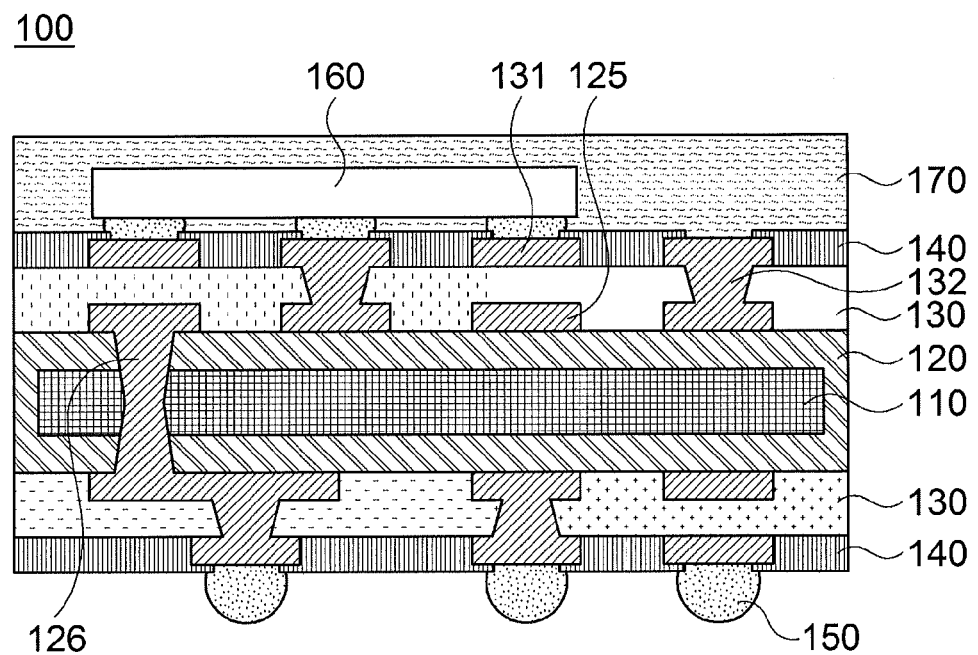

Next, FIG. 29 is a cross-sectional view showing the state in which an electronic component is mounted on the build-up printed circuit board, and FIG. 30 is a cross-sectional view showing the state in which the array printed circuit board of FIG. 29 is cut into unit printed circuit boards.

As shown, in the printed circuit board of the present embodiment, after the insulator 120 and the build-up layer 130 are laminated on the core substrate 50, an electronic component 160 may be mounted on one surface of the printed circuit board by soldering. Further, a connection means 150 such as a solder ball may be coupled to the opposite surface of the surface on which the electronic component 160 is mounted. The connection means 150 may function as an electrical connection means when the printed circuit board 100 of the present embodiment is mounted on a main board.

Further, a molding portion 170 may be formed on the printed circuit board 100 to surround an outer peripheral surface of the electronic component 160. The molding portion 170 may be mainly an EMC molding material of an epoxy material and integrally formed on the printed circuit board 100 to be configured in the form of a package.

Next, when the electronic component is mounted on the printed circuit board 100 and the molding process is completed, the array printed circuit board may be cut into unit printed circuit boards along a dicing line D. Typically, the cutting of the printed circuit board 100 may be performed by a cutting means B such as a blade, and the molding portion 170 and the printed circuit board 100 may be cut at the same time to configure the unit printed circuit board of FIG. 30.

At this time, when cutting into the unit printed circuit boards using the cutting means B, the cutting may be performed through the slit 32 portion formed in the core 110 of the printed circuit board 100, and the insulator 120 may be cut around the dam 33 formed between the plurality of slits 32 to prevent a blade as the cutting means B from being in contact with a side surface of the core 110. Accordingly, stress generated during the cutting of the printed circuit board cannot be transmitted to the core 110 to prevent breakage or fine cracks of the core 110 in the printed circuit board.

Further, as the blade as the cutting means B passes through the dam 33 of the slit 32 forming portion, the unit printed circuit board 100 may be cut in a state in which the insulator 120 is covered on the side surface of the core 110 to prevent exposure of the side surface of the core 110.

In the present embodiment, the same elements as those in the above-described method of manufacturing a printed circuit board are represented by the same reference numerals.

Meanwhile, in the embodiments of the method of manufacturing a printed circuit board, a fine pattern circuit may be formed on the glass sheet, which is used as the core exclusively, to be laminated or embedded in the insulator 120.

That is, in an embodiment of the method of manufacturing a printed circuit board according to the present invention, after the step of laminating the glass sheet 31 on the first insulator 21 and processing the slit 32 and before the step of laminating the second insulator 22 on the glass sheet 31, the circuit may be formed on the glass sheet 31 which is exclusively used as the core.

Further, in another embodiment of the method of manufacturing a printed circuit board according to the present invention, after the step of processing the slit 32 in the glass sheet 31 laminated on the first insulator 21 and before the step of embedding the glass sheet 31 in the second insulator 22 laminated on the carrier 10, the fine pattern circuit may be formed on the glass sheet 31 which is exclusively used as the core.

The circuit may be formed by a tenting or subtractive method of a typical circuit forming process and may consist of a thin pattern such as an inductor, a capacitor, or a resistor in addition to the fine circuit when necessary. Therefore, the printed circuit board of the present embodiment can implement a function of embedding a passive element by the thin pattern formed on the core 10 without embedding a separate passive element therein.

Finally, FIGS. 31A through 31D are is a cross-sectional views showing the shape of the side surface of the core employed in the printed circuit board in accordance with the embodiments of the present invention.

As shown, the core 110 employed in the printed circuit board of the present embodiments may be formed so that the side surface thereof has the same or different lengths based on the upper and lower surfaces.

Figure 31A:
FIGS. 31A through 31D are cross-sectional views of the shape of a side surface of a core employed in the printed circuit board of the present invention.
Figure 31B:

That is, as in FIGS. 31A and 31B, the core 110 may be formed so that the side surface thereof is formed at a right angle to the upper and lower surfaces or formed in a concave shape while having the same upper and lower lengths. The side surface may be formed at a right angle to the upper and lower surfaces using a blade or a wire saw as in FIG. 31A, and the concave shape may be formed by a chemical processing method using etching.

Figure 31C:
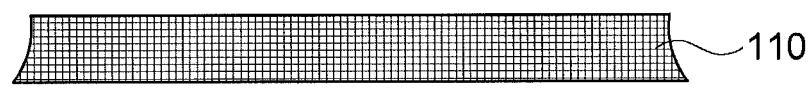
Figure 31D:
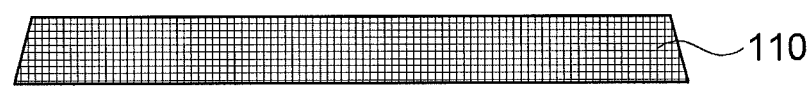

Further, as in FIGS. 31C and 31D, the shape having the different upper and lower lengths may be formed mainly by etching or laser processing.

At this time, in the shapes like FIGS. 31A and 31B, warpage may not occur in one direction during the lamination process of the printed circuit board, and in the shapes like FIGS. 31C and 31D, warpage may occur in one direction during the lamination process of the printed circuit board and thus the warpage direction of the printed circuit board may be controlled according to the processing direction of the side surface of the core 110.

As described above, the printed circuit board and the method of manufacturing the same according to the present invention can prevent the breakage or fine cracks of the core in the printed circuit board by cutting the slit portion formed in the core along the dicing line when cutting the unit printed circuit board to prevent the cutting means from being in direct contact with the cut side surface of the core and thus prevent the stress generated during the cutting from being transmitted to the core.

Further, the printed circuit board and the method of manufacturing the same according to the present invention can prevent the side surface of the core from being exposed to the outside by allowing the cutting means to pass through the dam of the slit forming portion of the core to cut the unit printed circuit board in a state in which the insulator is covered on the side surface of the core.

The above-described preferred embodiments of the present invention are disclosed for the purpose of exemplification and it will be appreciated by those skilled in the art that various substitutions, modifications and variations may be made in these embodiments without departing from the technical spirit of the present invention. Such substitutions and modifications are intended to be included in the appended claims.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A method of manufacturing a printed circuit board comprising a core made of a glass material and having a through hole, an insulator formed on top, bottom, and all lateral sides of the core, and a via in the through hole passing through the core and the insulator, the via electrically connecting between circuit layers on opposite sides of the core, the method comprising:

forming sets of slits in a glass sheet of the glass material, each set of slits having two parallel slits extending from a top surface to a bottom surface of the glass sheet and formed to define a dam comprised of an uncut portion of the glass sheet located between the two slits, one of the sets of slits being formed along each lateral side surface of each of a plurality of unit regions of the glass sheet to surround every lateral side surface of the plurality of unit regions;

coupling an insulating member to the glass sheet such that a portion of the insulating member is on the dam and other portions of the insulating member fill into the slits on opposite sides of the dam, the insulating member and the glass sheet collectively forming a substrate; and cutting the substrate along dicing lines.

2. A method of manufacturing a printed circuit board comprising a core made of a glass sheet and having a through hole, an insulator formed on a first surface, a second surface opposite to the first surface, and all lateral side surfaces of the glass sheet, and a via in the through hole passing through the glass sheet and the insulator, the via electrically connecting between circuit layers on opposite sides of the core, the method comprising:

coupling a first insulating member and the first surface of the glass material, the glass material comprising unit regions;

forming sets of slits in the glass sheet along each lateral side surface of each unit region of the glass sheet to surround every lateral side surface of the unit regions, each set of slits comprising two parallel slits extending from the first surface to the second surface and formed to define a dam comprised of an uncut portion of the glass sheet located between the two slits;

coupling a second insulating member to the glass sheet such that respective portions of the second insulating member are on each dam, filling the slits on each side of each dam, and on the second surface of the glass material, the first insulating member and the second insulating member forming the insulator of the core; and cutting along the dams on each lateral side of a unit region to form the core.

3. A method of manufacturing a printed circuit board comprising a core made of a glass sheet and having a through hole, an insulator formed on a first surface, a second surface opposite to the first surface, and all lateral side surfaces of the glass sheet, and a via in the through hole passing through the glass sheet and the insulator, the via electrically connecting between circuit layers on opposite sides of the core, the method comprising:

forming sets of parallel slits from the first surface to the second surface of the glass sheet to expose lateral side surfaces of unit regions of the glass sheet, wherein an area between the parallel slits defines a dam comprised of an uncut portion of the glass sheet, and each lateral side of each unit region is bounded by a set of the sets of parallel slits; and filling the slits with the insulator.

* * * * *